(12) United States Patent
Yamanaka

(10) Patent No.: US 6,798,805 B2
(45) Date of Patent: Sep. 28, 2004

(54) SEMICONDUCTOR LASER DEVICE CONTAINING CONTROLLED INTERFACE OXYGEN AT BOTH END FACETS

(75) Inventor: Fusao Yamanaka, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/232,525

(22) Filed: Sep. 3, 2002

(65) Prior Publication Data

US 2003/0048823 A1 Mar. 13, 2003

(30) Foreign Application Priority Data

Sep. 3, 2001 (JP) .................................... 2001-265356

(51) Int. Cl.[7] .............................................. H01S 5/00
(52) U.S. Cl. ........................................ 372/43; 372/35
(58) Field of Search ............................. 372/45, 43, 49, 372/47, 46, 36

(56) References Cited

U.S. PATENT DOCUMENTS

| | | | | |
|---|---|---|---|---|
| 4,563,368 A | * | 1/1986 | Tihanyi et al. ................ | 438/38 |
| 4,656,638 A | * | 4/1987 | Tihanyi et al. ................ | 372/49 |
| 4,975,922 A | * | 12/1990 | Sakane et al. ................ | 372/49 |
| 5,144,634 A | | 9/1992 | Gasser et al. | |
| 5,960,021 A | * | 9/1999 | De Vrieze et al. ............ | 372/49 |
| 5,962,873 A | * | 10/1999 | Ohkubo et al. ............... | 257/94 |
| 6,323,052 B1 | | 11/2001 | Horie et al. | |
| 6,359,921 B1 | * | 3/2002 | Yamanaka .................... | 372/49 |
| 6,438,150 B1 | * | 8/2002 | Yoo ............................. | 372/49 |
| 6,529,537 B2 | * | 3/2003 | Yamanaka .................... | 372/49 |
| 6,618,409 B1 | * | 9/2003 | Hu et al. ...................... | 372/43 |

FOREIGN PATENT DOCUMENTS

| | | |
|---|---|---|
| JP | 58-125832 | 7/1993 |
| JP | 11-121877 | 4/1999 |

* cited by examiner

*Primary Examiner*—Don Wong
*Assistant Examiner*—Tuan N. Nguyen
(74) *Attorney, Agent, or Firm*—Sughrue Mion, PLLC

(57) ABSTRACT

In a semiconductor laser device: a multilayer structure including a plurality of semiconductor layers is formed on a substrate; and at least one dielectric layer is formed on each of two end facets of the multilayer structure, where the at least one dielectric layer on each of the two end facets includes a reflectance control layer. In addition, at least one portion of the multilayer structure in at least one vicinity of at least one of the two end facets contains 10 to 1,500 times more oxygen than the other portions of the multilayer structure.

8 Claims, 9 Drawing Sheets

SEMICONDUCTOR LASER DEVICE CONTAINING CONTROLLED INTERFACE OXYGEN AT BOTH END FACETS

BACKGROUND OF THE INVENTION

1. Field of the Invention

The present invention relates to a semiconductor laser device in which light-emission end facets are coated with dielectric layers.

2. Description of the Related Art

Conventionally, in various types of known semiconductor laser devices, a semiconductor multilayer structure is formed on a substrate, and dielectric layers including a reflectance control layer are formed on two end facets of the semiconductor multilayer structure so as to realize resonator faces at the end facets. In these types of semiconductor laser devices, semiconductor materials are oxidized in vicinities of interfaces with the dielectric layers at both resonator faces, and often facet degradation occurs. Therefore, some techniques have been proposed for solving this problem.

Japanese Unexamined Patent Publication No. 58(1983)-125832 discloses that it is effective to remove oxidation layers produced on end facets of a semiconductor multilayer structure in a semiconductor laser device as mentioned above by use of various types of etching before surfaces of compound semiconductor materials are passivated.

U.S. Pat. No. 5,144,634 discloses a semiconductor laser device having oxygen free resonator faces and a technique for realizing the oxygen free resonator faces.

Japanese Unexamined Patent Publication No. 11(1999)-121877 discloses that it is possible to realize a state in which oxidation of resonator faces of a semiconductor laser device made of compound semiconductors is not detected by XPS (X-ray photoelectron spectrometry) analysis, when the resonator faces are processed with low-energy charged particles.

However, Japanese Unexamined Patent Publication No. 58(1983)-125832 does not disclose to what extent the natural oxidation layers should be removed, i.e., what oxygen content near-edge portions of the semiconductor multilayer structure (i.e., portions of the semiconductor multilayer structure in vicinities of resonator faces) should contain, in order to obtain a satisfactory result.

In addition, it is not proved that true oxygen-free state can be realized in the vicinities of the resonator faces by the technique disclosed in U.S. Pat. No. 5,144,634. Although the above technique may be able to realize a state in which a very small amount of oxygen remains, U.S. Pat. No. 5,144,634 does not disclose the actual amount of residual oxygen achieved by the technique.

Further, the present inventor made an investigation of the XPS analysis disclosed in Japanese Unexamined Patent Publication No. 11(1999)-121877, and found that SIMS (secondary ion mass spectrometry) can detect an unignorable amount of residual oxygen even when XPS cannot detect the residual oxygen. However, Japanese Unexamined Patent Publication No. 11(1999)-121877 does not report an actual amount of residual oxygen which can be achieved by the technique of Japanese Unexamined Patent Publication No. 11(1999)-121877 and cannot be detected by the XPS analysis.

SUMMARY OF THE INVENTION

The object of the present invention is to provide a reliable semiconductor laser device in which oxygen contents in portions of a semiconductor multilayer structure in vicinities of resonator faces are in a satisfactory range.

According to the present invention, there is provided a semiconductor laser device comprising: a multilayer structure including a plurality of semiconductor layers and being formed of a substrate; and at least one dielectric layer formed on each of two end facets of the multilayer structure, where the at least one dielectric layer on each of the two end facets includes a reflectance control layer. In addition, the oxygen content in at least one portion of the multilayer structure in at least one vicinity of at least one of the two end facets is 10 to 1,500 times higher than the oxygen content in the other portions of the multilayer structure.

Preferably, the semiconductor laser device according to the present invention may also have one or any possible combination of the following additional features (i) to (vii).

(i) The oxygen content in the at least one portion of the multilayer structure is 15 to 1,000 times higher than the oxygen content in the other portions of the multilayer structure.

(ii) The at least one dielectric layer comprises: a passivation layer formed directly on each of the two end facets of the multilayer structure; and the reflectance control layer formed on the passivation layer.

(iii) The passivation layer is made of at least one of Ge, Si, and C.

(iv) The passivation layer is made of an oxide containing at least one of Al, Ga, Si, Ge, Ta, and Ti.

(v) The passivation layer is made of a nitride containing at least one of Al, Ga, In, Si, Ge, C, Ta, and Ti.

(vi) The reflectance control layer is made of an oxide containing at least one of Al, Ga, Si, Ge, Ta, and Ti.

(vii) The reflectance control layer is made of a nitride containing at least one of Al, Ga, In, Si, Ge, C, Ta, and Ti.

Typically, the semiconductor laser device according to the present invention can be formed by using InGaN-based, ZnSSe-based, InGaAlP-based, AlGaAs-based, InGaAsP-based, InGaAs-based, and InGaSb-based compound materials, where the oscillation wavelengths of the InGaN-based compound semiconductor laser devices are in the range between 360 to 500 nm, the oscillation wavelengths of the ZnSSe-based compound semiconductor laser devices are in the range between 410 to 540 nm, the oscillation wavelengths of the InGaAlP-based compound semiconductor laser devices are in the range between 600 to 730 nm, the oscillation wavelengths of the AlGaAs-based compound semiconductor laser devices are in the range between 750 to 870 nm, the oscillation wavelengths of the InGaAsP-based compound semiconductor laser devices are in the ranges between 700 to 1,200 nm and 1,300 to 1,900 nm, the oscillation wavelengths of the InGaAs-based compound semiconductor laser devices are in the ranges between 950 to 1,200 nm and 1,300 to 1,900 nm, and the oscillation wavelengths of the InGaSb-based compound semiconductor laser devices are in the range between 1,800 to 3,000 nm.

The present inventor has found that the reliability of semiconductor laser devices is decreased when the oxygen content in near-edge portions of the semiconductor multilayer structure (i.e., portions of the semiconductor multilayer structure in vicinities of resonator faces) is very low as well as when the oxygen content in the near-edge portions of the semiconductor multilayer structure is high.

It is considered that when the oxygen content in the vicinities of the resonator faces is very low, the reliability is decreased for the following reasons (1) and (2):

(1) When oxidation layers on end facets of semiconductor laser devices are excessively etched by various types of etching as disclosed in JUPP No. 58(1983)-125832 in an attempt to more surely remove the oxidation layers, the end facets are damaged, and therefore the reliability is decreased.

(2) It is confirmed that a very small amount of oxygen remaining in the vicinities of the end facets of the semiconductor multilayer structure compensates, to some degree, for lattice defects caused by cleavage for producing the end facets. Therefore, when the oxygen content is too low, the lattice defects are not compensated for, and the performance of the semiconductor laser devices is decreased, i.e., the reliability is decreased.

In view of the above considerations, in the semiconductor laser device according to the present invention, the oxygen content in at least one portion of the semiconductor multilayer structure in the at least one vicinity of the at least one end facet, on which the at least one dielectric layer is formed, is set to 10 to 1,500 times (preferably 15 to 1,000 times) higher than the oxygen content in the other portions of the semiconductor multilayer structure. Therefore, the reliability (specifically, lifetime) of the semiconductor laser device according to the present invention is remarkably increased compared with the conventional semiconductor laser devices. The grounds of the above numerical limitations are explained later in conjunction with the embodiments of the present invention.

DESCRIPTION OF PREFERRED EMBODIMENTS

Embodiments of the present invention are explained in detail below with reference to drawings.

First Embodiment

Figure 1:
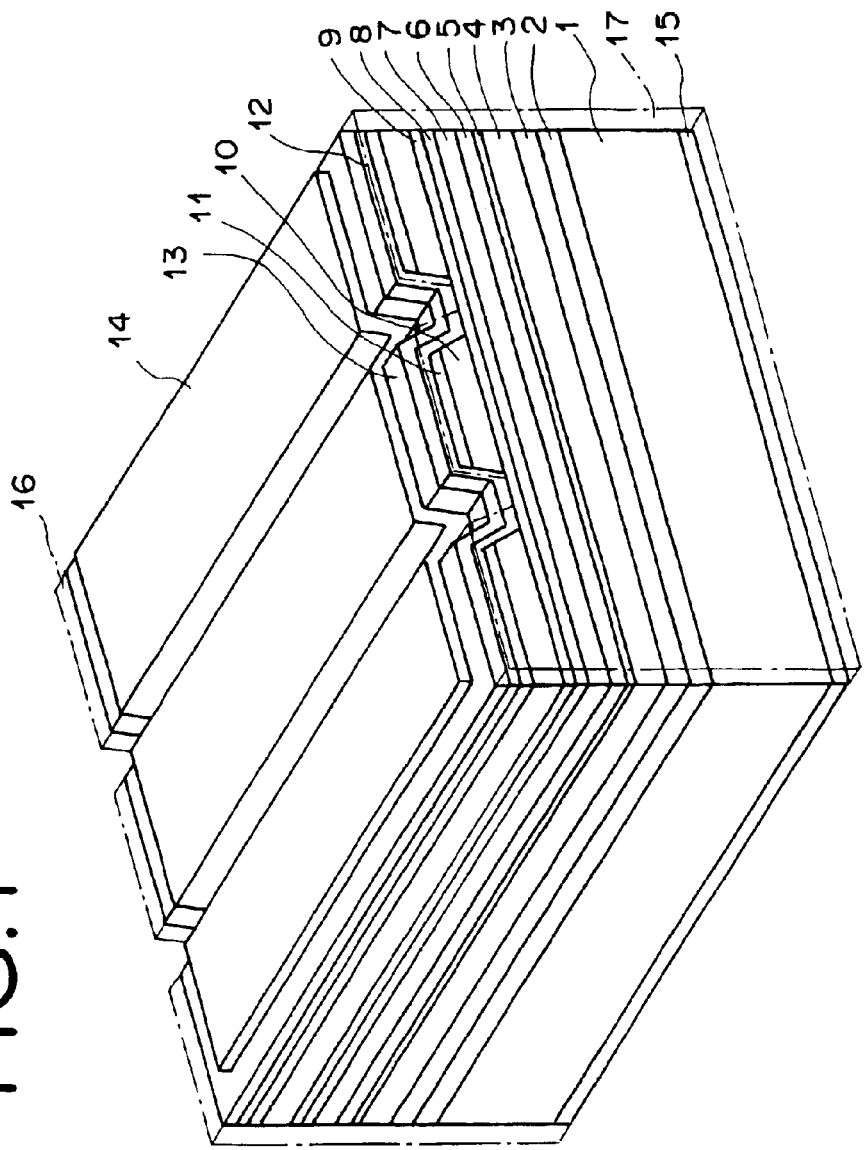
FIG. 1 is a diagrammatical perspective view of a semiconductor laser device as a first embodiment of the present invention.

FIG. 1 is a diagrammatical perspective view of a semiconductor laser device as the first embodiment of the present invention. The semiconductor laser device as the first embodiment and a process for producing the semiconductor laser device are explained below.

First, an n-type $Ga_{1-z1}Al_{z1}As$ lower cladding layer 2, an n-type or i-type (intrinsic) $In_{x1}Ga_{1-x1}As_{1-y1}P_{y1}$ lower optical waveguide layer 3, an i-type $In_{x2}Ga_{1-x2}As_{1-y2}P_{y2}$ lower barrier layer 4, an $In_{x3}Ga_{1-x3}As_{1-y3}P_{y3}$ quantum-well active layer 5, an i-type $In_{x2}Ga_{1-x2}As_{1-y2}P_{y2}$ upper barrier layer 6, a p-type or i-type $In_{x1}Ga_{1-x1}As_{1-y1}P_{y1}$ upper optical waveguide layer 7, a p-type $Ga_{1-z1}Al_{z1}As$ first upper cladding layer 8, a p-type InGaP etching stop layer 9, a p-type $Ga_{1-z1}Al_{z1}As$ second upper cladding layer 10, and a p-type GaAs contact layer 11 are formed in this order on an n-type GaAs substrate 1 by organometallic vapor phase epitaxy. Each of the n-type $Ga_{1-z1}Al_{z1}As$ lower cladding layer 2, the p-type $Ga_{1-z1}Al_{z1}As$ first upper cladding layer 8, the n-type or i-type (intrinsic) $In_{x1}Ga_{1-x1}As_{1-y1}P_{y1}$ lower optical waveguide layer 3, and the p-type or i-type $In_{x1}Ga_{1-x1}As_{1-y1}P_{y1}$ upper optical waveguide layer 7 has such a composition as to lattice-match with the n-type GaAs substrate 1.

Next, a $SiO_2$ insulation film (not shown) is formed on the p-type GaAs contact layer 11, and a pair of parallel stripe areas of the $SiO_2$ insulation film each having a width of about 10 micrometers are removed by conventional lithography, where the pair of parallel stripe areas are located on both sides of a stripe area corresponding to a ridge stripe and having a width of about 50 micrometers. Then, regions of the p-type GaAs contact layer 11 and the p-type $Ga_{1-z1}Al_{z1}As$ second upper cladding layer 10 located under the pair of parallel stripe areas of the $SiO_2$ insulation film are removed by wet etching by using the remaining areas of the $SiO_2$ insulation film as a mask. Thus, the ridge stripe is formed. In the above etching, a solution of sulfuric acid and hydrogen peroxide is used as an etchant, and therefore the etching automatically stops at the upper boundary of the p-type InGaP etching stop layer 9.

After the remaining areas of the $SiO_2$ insulation film are removed, an insulation film 12 is formed on the entire surface of the layered structure formed as above. Then, a portion of the insulation film 12 located on the ridge stripe is removed by conventional lithography so that a current injection window is produced. Subsequently, a p electrode 13 is formed over the insulation film 12 and the current injection window, and is then coated with Au plating 14 having a thickness of 5 micrometers or greater. Thereafter, the bottom surface of the n-type GaAs substrate 1 is polished until the thickness becomes about 100 to 150 micrometers, and an n electrode 15 is formed on the polished surface.

The oscillation wavelength of the semiconductor laser device as the first embodiment can be controlled in the range of 750 to 1,100 nm when the composition of the $In_{x3}Ga_{1-x3}As_{1-y3}P_{y3}$ quantum-well active layer 5 is controlled in the ranges of $0 \leq x3 \leq 0.5$ and $0 \leq y3 \leq 0.5$. In a concrete example of the semiconductor laser device as the first embodiment, an n-type $Ga_{0.39}Al_{0.61}As$ lower cladding layer 2, an i-type $In_{0.49}Ga_{0.51}P$ lower optical waveguide layer 3, an i-type $In_{0.4}Ga_{0.6}P$ lower barrier layer 4, an $In_{0.13}Ga_{0.87}As_{0.75}P_{0.25}$ quantum-well active layer 5, an i-type $In_{0.4}Ga_{0.6}P$ upper barrier layer 6, an i-type $In_{0.49}Ga_{0.51}P$ upper optical waveguide layer 7, a p-type $Ga_{0.39}Al_{0.6}As$ first upper cladding layer 8, a p-type InGaP etching stop layer 9, a p-type $Ga_{0.39}Al_{0.61}As$ second upper cladding layer 10, and a p-type GaAs contact layer 11 are formed in this order on an n-type GaAs substrate 1. In this example, the oscillation wavelength is 810 nm.

The semiconductor laser device as the first embodiment is a transverse multimode laser having an emission width (stripe width) greater than 5 micrometers. Each layer in the construction of the first embodiment may be formed by molecular beam epitaxy using solid or gas raw material, instead of the organometallic vapor phase epitaxy.

Figure 2:
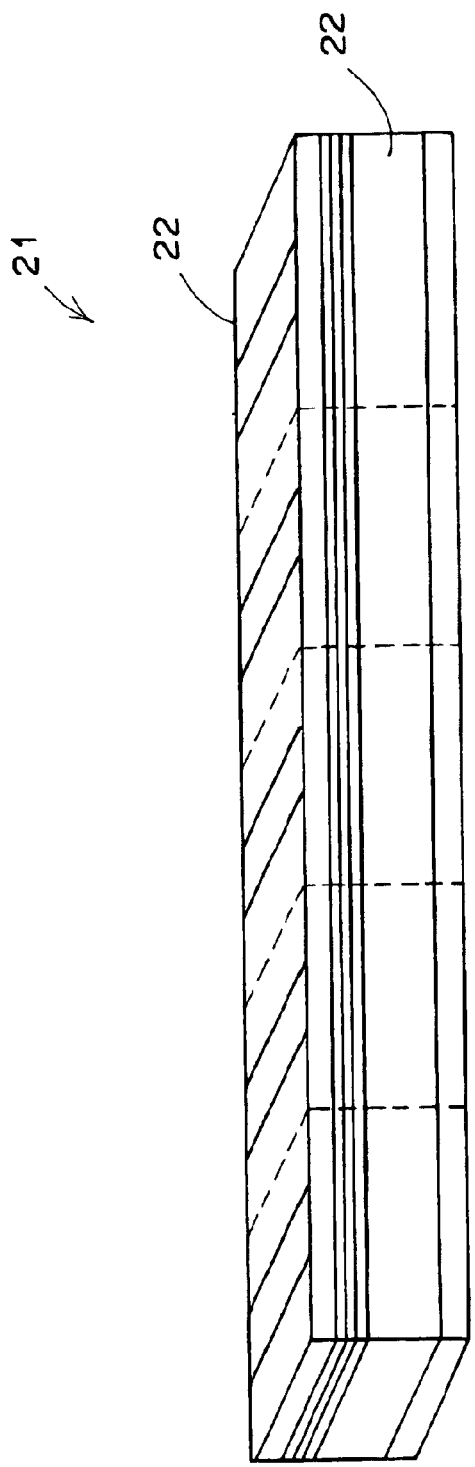
FIG. 2 is a perspective view of a bar in which a plurality of semiconductor laser devices are formed.

After the formation of the n electrode 15, light-emission end facets are formed as follows. In practice, a plurality of semiconductor laser devices each having the layered structure of FIG. 1 are concurrently produced on a wafer of the n-type GaAs substrate 1. The wafer on which the layered structure of FIG. 1 is formed for each semiconductor laser device are cleaved in air along (100) planes which are equally spaced by a predetermined resonator length (e.g., 0.9 mm) so that bars 21 as illustrated in FIG. 2 are obtained, where the bars 21 have a length of 10 to 20 mm. Next, each of the bars 21 obtained as above is fixed to a jig in air, where the jig is designed to allow coating of two light-emission end facets 22 of the bar 21, and then the jig is set in an ECR (electron cyclotron resonance) sputtering system, in which the two light-emission end facets 22 are etched.

In the above etching, argon (Ar) gas is used, and oxidation layers at the light-emission end facets 22 are removed by appropriately adjusting gas pressure. Generally, the gas pressure is adjusted in the range of $1 \times 10^{-2}$ to $3 \times 10^{-1}$ Pa.

Generally, the amounts of residual oxygen at the light-emission end facets 22 decrease with the lapse of etching time, and such a decrease is also confirmed in the present embodiment. Specifically, in the present embodiment, the gas pressure in the etching is controlled in the range of 2 to $3 \times 10^{-1}$ Pa.

Figure 3:
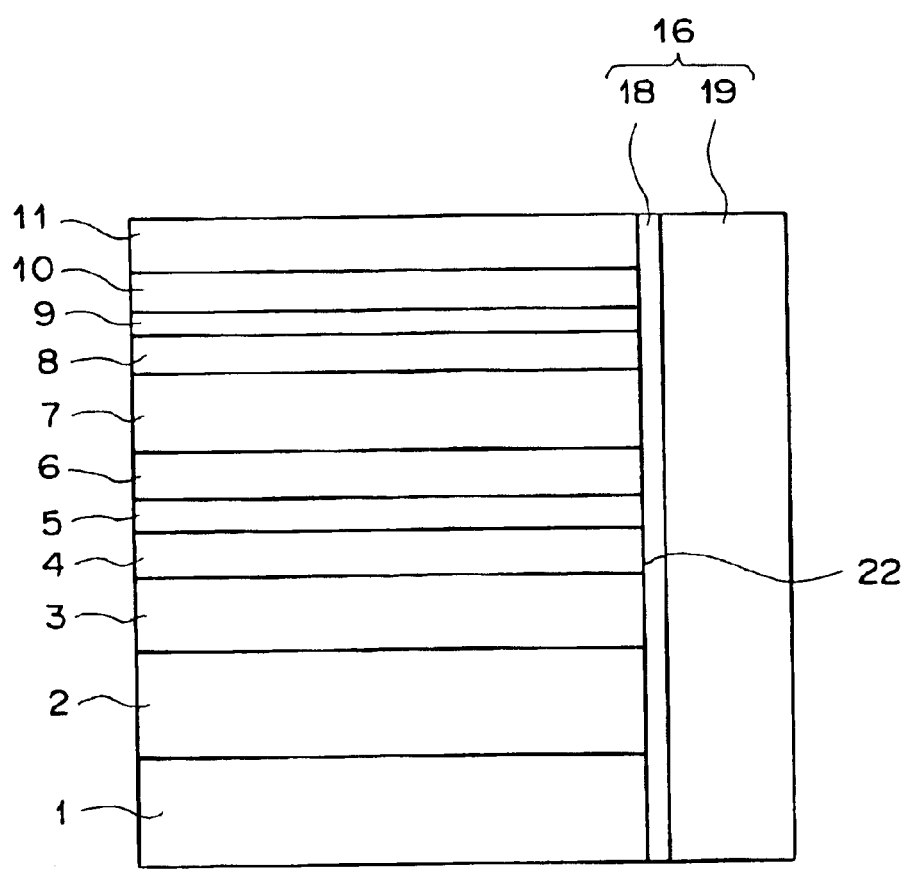
FIG. 3 is a diagrammatical side view of a portion of the semiconductor laser device as the first embodiment of the present invention in a vicinity of a light-emission end facet.

After the above etching is completed, first and second dielectric layers 16 and 17 are respectively formed on the light-emission end facets 22 realizing resonator faces. FIG. 3 shows details of the first dielectric layer 16 formed on one of the light-emission end facets 22. As illustrated in FIG. 3, a first passivation layer 18 being made of a silicon film and having a thickness of 1 nm is formed on the one of the light-emission end facets 22, and a first reflectance control layer 19 is formed on the first passivation layer 18. The first reflectance control layer 19 also behaves as a protection layer.

In the present embodiment, the bar 21 is set in a sputtering system in order to form the first reflectance control layer 19 after the first passivation layer 18 is formed. The first reflectance control layer 19 is made of $Si_3N_4$ and has a thickness equal to $d_1 = 80 \cdot \lambda/2n_1$, where $\lambda$ is the oscillation wavelength (e.g., 810 nm), and $n_1$ is the refractive index of $Si_3N_4$ (i.e., 1.97). Thus, the first reflectance control layer 19 realizes the reflectance of 32%.

In addition, the second dielectric layer 17 formed on the other of the light-emission end facets 22 comprises a second passivation layer similar to the first passivation layer 18 and a second reflectance control layer realizing a reflectance of 95% or greater. The second passivation layer is formed on the other of the light-emission end facets 22, and the second reflectance control layer is formed on the second passivation layer. The second reflectance control layer is realized by a multilayer film constituted by $Al_2O_3/TiO_2/SiO_2/TiO_2/SiO_2/TiO_2/SiO_2/TiO_2/SiO_2/TiO_2$ sublayers formed on the second passivation layer in this order. Each of the sublayers has a thickness equal to $d_2 = \lambda/4n_2$, where $n_2$ is the refractive index of the material of each sublayer.

Interface Oxygen Content

The oxygen content in a near-edge portion of the semiconductor multilayer structure (i.e., a portion of the semiconductor multilayer structure in a vicinity of one of the resonator faces), on which the first dielectric layer 16 is formed, is explained below. Hereinafter, an oxygen content in the near-edge portion of the semiconductor multilayer structure is referred to as an interface oxygen content. The present inventor has obtained the interface oxygen content under the first dielectric layer 16 based on measurement of depth profiles of various components in the near-edge portion of the semiconductor multilayer structure by use of a secondary ion mass spectrometry (SIMS). The details of the measurement conditions are indicated in Table 1.

TABLE 1

| (1) Analyzing Equipment | D-SIMS PHI ADEPT 1010, manufactured by Physical Electronics Inc. |
|---|---|
| (2) Analysis Condition | |
| Primary Ion | (a) Source: Cesium Cs+ |
| | (b) Acceleration voltage: 1 kV |
| | (c) Current Intensity: 10 nA |
| | (d) Scanning area: 120 × 120 $\mu m^2$ |
| | (e) Incident angle: 60 deg |
| Secondary Ion | (a) Polarity: Negative |
| | (b) Gate: 4% (24 × 48 $\mu m^2$) |
| | (c) FA: #3 |
| | (d) M/dM: 0.5 |
| | (e) O2-Leak: No |

| Species | Cumulative Time (sec) |
|---|---|
| 30Si− | 0.5 |
| 29Si + 14N− | 0.5 |
| 16O− | 0.5 |
| 18O− | 1.5 |
| 69Ga− | 0.5 |
| 75As− | 0.5 |
| 75As + 16O− | 1.5 |
| 30Si + 16O− | 1.5 |

Figure 4:
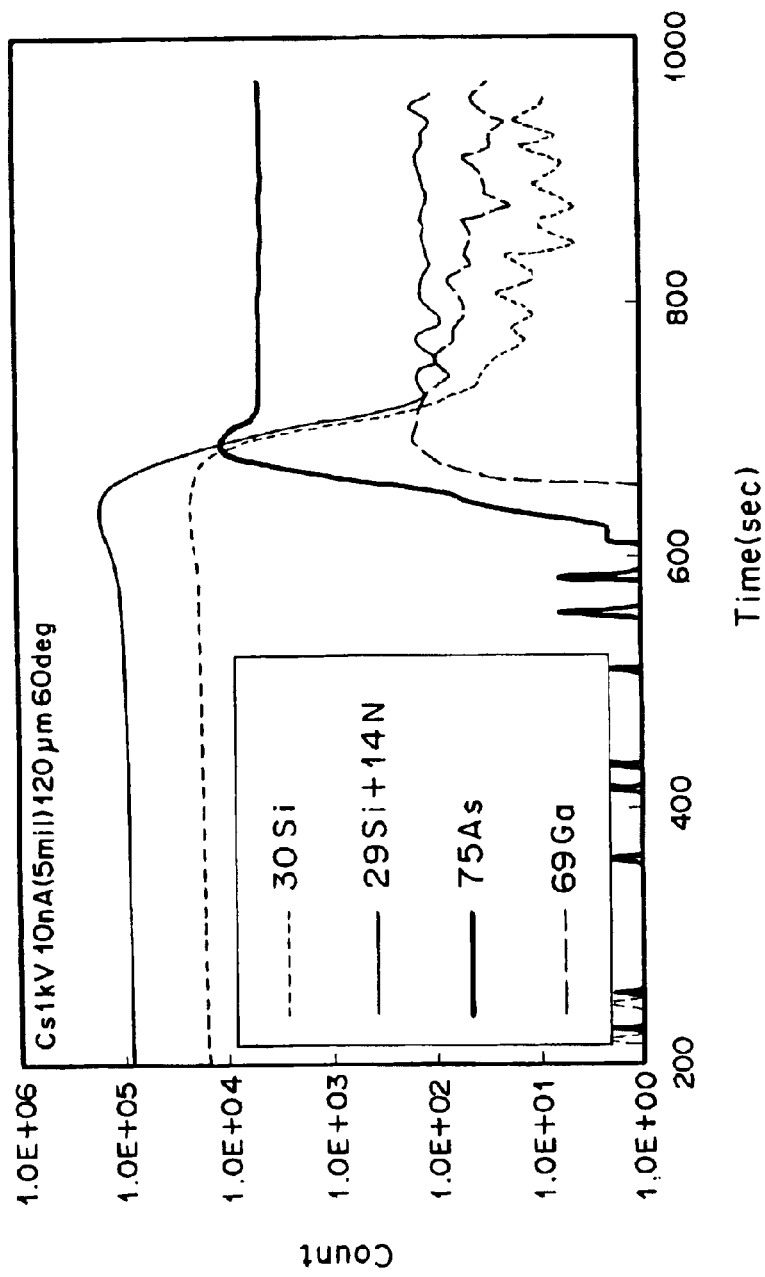
FIG. 4 is a graph indicating depth profiles of several components which do not include oxygen, in a vicinity of a light-emission end facet of the semiconductor laser device as the first embodiment of the present invention.
Figure 5:
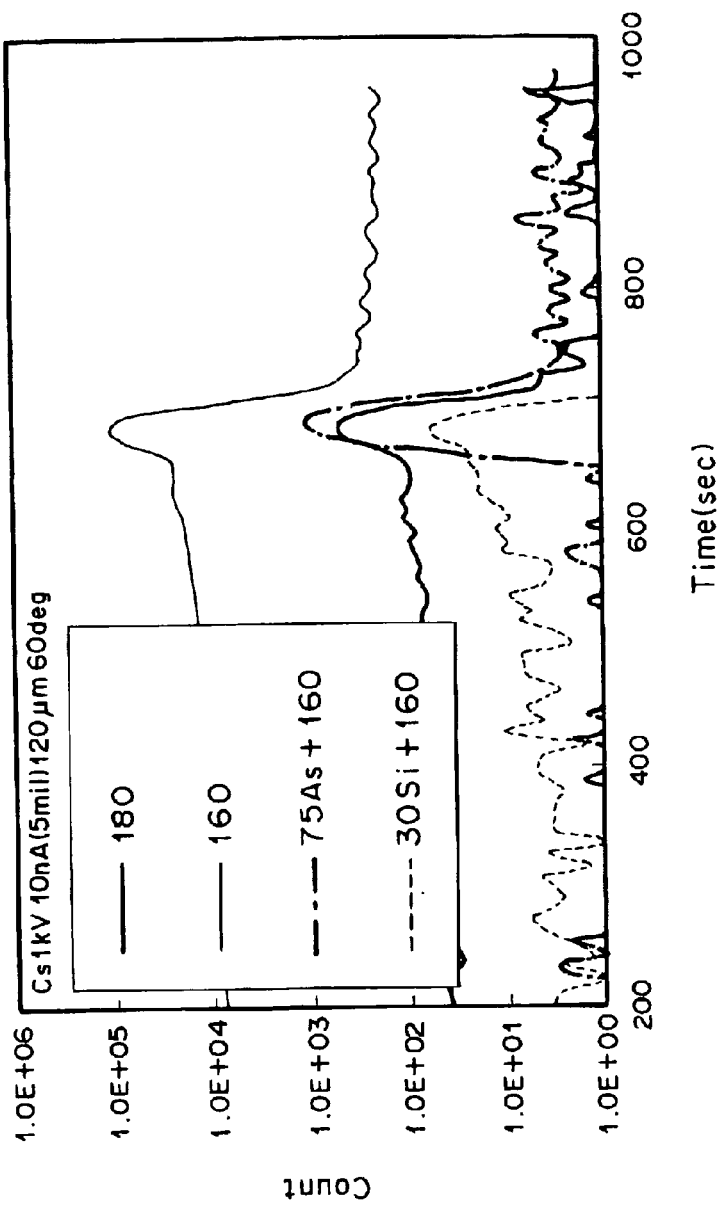
FIG. 5 is a graph indicating depth profiles of several components which include oxygen, in a vicinity of a light-emission end facet of the semiconductor laser device as the first embodiment of the present invention.
Figure 6:
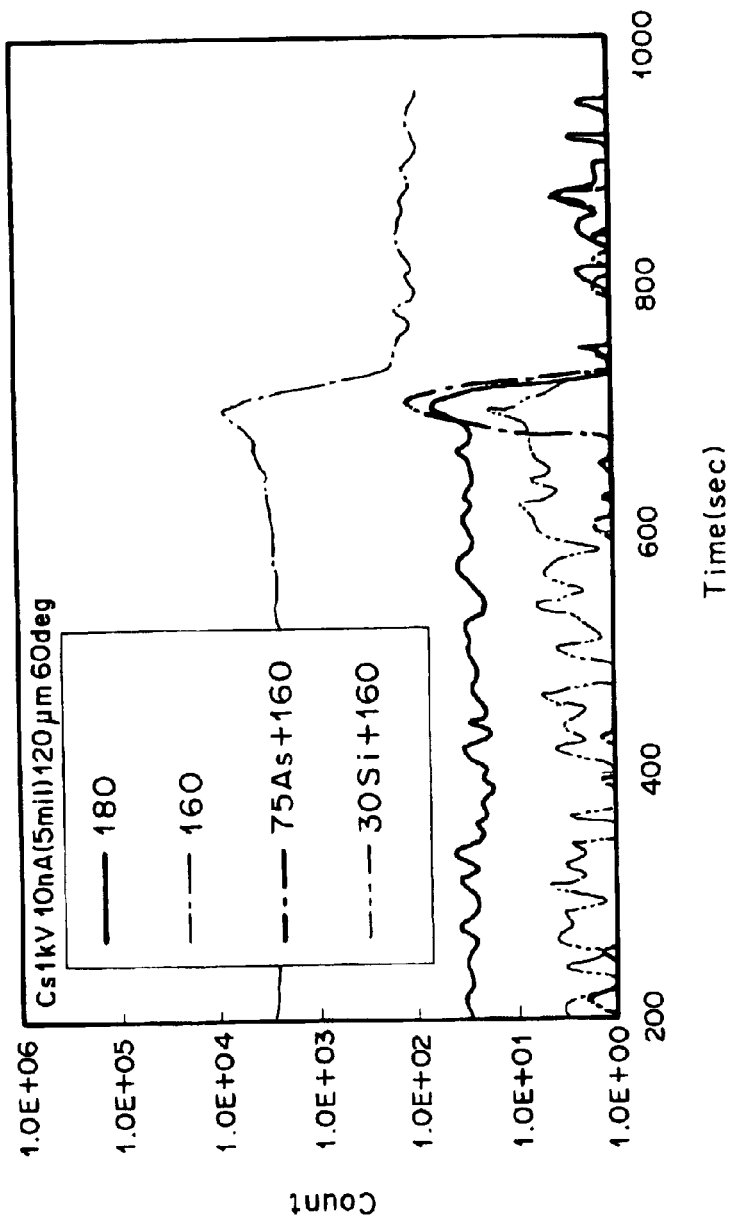
FIG. 6 is a graph indicating another depth profile of several components including oxygen in a vicinity of a light-emission end facet of the semiconductor laser device as the first embodiment of the present invention, which is produced under a different condition from the semiconductor laser device in FIG. 5.

In FIG. 4, depth profiles of 30Si, 29Si+14N, 75As, and 69Ga are indicated as measurement results of components which do not include oxygen. In FIGS. 5 and 6, depth profiles of 16O, 18O, 75As+16O, and 30Si+16O are indicated as measurement results of components which include oxygen. The abscissa in each of FIGS. 4 to 6 indicates a time during which an operation of milling a specimen proceeds from a surface of a dielectric ($Si_3N_4$) layer in the depth direction, and the ordinate in each of FIGS. 4 to 6 indicates a count of each ion species in each measurement point in the depth direction. That is, in FIGS. 4 to 6, greater values on the abscissa correspond to deeper measurement points.

In the construction of FIG. 3, the components of 69Ga and 75As in the time range of 675 to 700 seconds have intensities equivalent to those in the GaAs substrate. Therefore, it is possible to confirm that the time range of 675 to 700 seconds corresponds to an interface between the GaAs layer and the Si layer. FIGS. 5 and 6 show results of SIMS analyses of components including oxygen in specimens which are produced by etching the end facet of the semiconductor multilayer structure in FIG. 3 for different etching times before the formation of the Si passivation layer 18. The etching times for the end facet of the semiconductor multilayer structure in the specimens of FIGS. 5 and 6 are respectively 60 and 40 seconds. In each of FIGS. 5 and 6, it is possible to confirm existence of a peak of 75As+16O in the time range of 675 to 700 seconds, where the existence of the peak indicates that oxygen is coupled to the semiconductor material at the depth corresponding to the time range of 675 to 700 seconds. In addition, based on comparison of FIGS. 5 and 6, it is recognized that the peak of 75As+16O is smaller when the etching time for the end facet of the semiconductor multilayer structure is longer.

As illustrated in FIGS. 5 and 6, a peak of 18O exists at the interface between the GaAs layer and the Si passivation layer 18, and the formation of the peaks of 18O and 75As+16O at the interface indicates that oxygen at the interface is mainly coupled to GaAs.

Figure 7:
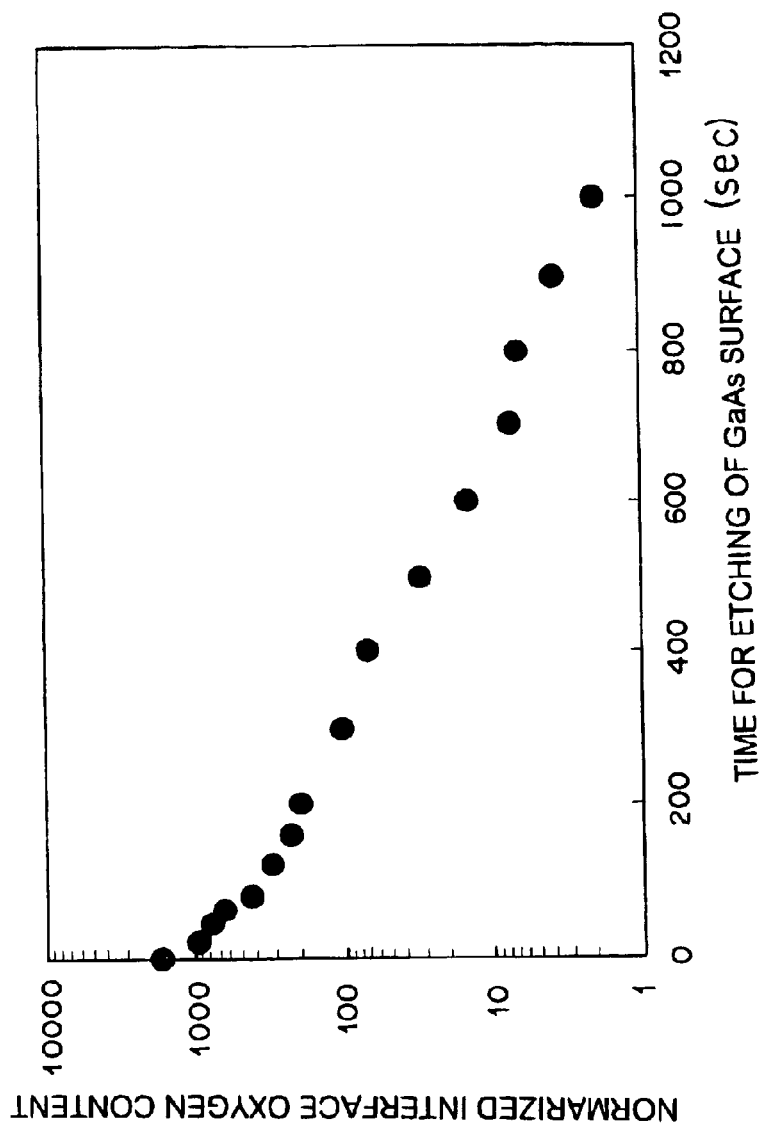
FIG. 7 is a graph indicating a relationship between an etching time and a normalized interface oxygen content in the semiconductor laser device as the first embodiment of the present invention.

The count (signal intensity) of 18O is measured as an oxygen content at the above interface in each of a plurality of specimens of the bar 21 which are produced by etching the end facet of the semiconductor multilayer structure in FIG. 3 for different etching times before the formation of the Si passivation layer 18. A normalized interface oxygen content is obtained by dividing the oxygen content at the above interface in each of the plurality of specimens by an average oxygen content (average signal intensity) in the GaAs substrate 1. FIG. 7 shows a relationship between the etching time for the end facet of the semiconductor multilayer structure and the normalized interface oxygen content. As understood from FIG. 7, the oxygen content in the specimen which is produced by etching the end facet of the semiconductor multilayer structure in FIG. 3 for 1,100 seconds is approximately equivalent to the oxygen amount in the GaAs substrate 1. At this time, a median value of the signal intensity of 18O in the time range in which the signal intensity of 75As in FIG. 4 is nearly constant (i.e., in the time range greater than 800 seconds) is obtained as the average oxygen amount (average signal intensity) in the GaAs substrate 1.

The concentration of each element of interest is proportional to the count in the measurement when the SIMS measurement condition and the material structure of the specimen is not changed. For example, a decrease in the value of the normalized interface oxygen content to one-tenth indicates a decrease in the oxygen concentration to one-tenth.

Mounting of Semiconductor Laser Element

The semiconductor laser device according to the present invention is mounted as follows.

After the dielectric layers 16 and 17 are formed on both of the light-emission end facets 22 of the bar 21 illustrated in FIG. 2, the bar 21 is cleaved into a plurality of semiconductor laser elements each having a width of 500 to 600 micrometers. In addition, a heatsink on which each semiconductor laser element is to be mounted is basically made of copper, which is coated with Ni plating having a thickness of 5 micrometers. Further, a Ni film having a thickness of 50 to 150 nm, a Pt film having a thickness of 50 to 200 nm, and an In film having a thickness of 3.5 to 6.0 micrometers are formed in this order on the Ni plating by evaporation. The area of the evaporation is greater than the area of each semiconductor laser element. Normally, the area of the evaporation is four or more times greater than the area of each semiconductor laser element. The heatsink is heated to a temperature range of 180 to 220° C. so as to melt the In film, and the p side of the semiconductor laser element is bonded to the heatsink.

Evaluation of Semiconductor Laser Element

The above semiconductor laser device as the first embodiment has been evaluated as follows.

Figure 8:
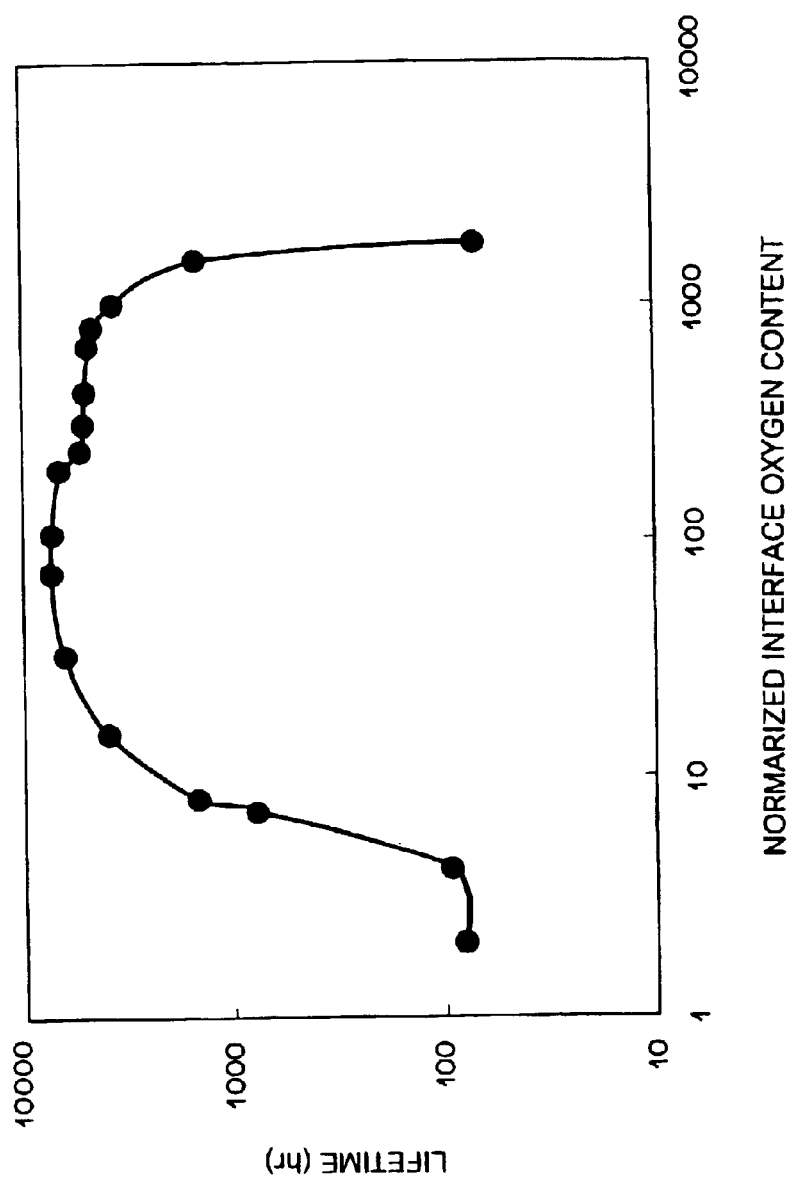
FIG. 8 is a graph indicating a relationship between a normalized interface oxygen content in the semiconductor laser device as the first embodiment of the present invention and the lifetime of the semiconductor laser device.

Seven or eight samples of each of sixteen different models of the semiconductor laser device as the first embodiment have been produced, where the sixteen different models respectively having different normalized interface oxygen contents, and a reliability test is performed on the seven or eight samples. The reliability is evaluated by measuring the lifetime (continuous lighting time) of each sample at an ambient temperature of 60° C. FIG. 8 shows the result of the measurement, i.e., the measured lifetimes corresponding to the different values of the normalized interface oxygen contents.

As illustrated in FIG. 8, when the normalized interface oxygen contents is in the range of 10 to 1,500 (more preferably 15 to 1,000), i.e., when the oxygen content in the near-edge portions of the semiconductor multilayer structure is 10 to 1,500 (more preferably 15 to 1,000) times the oxygen content in the other portions of the semiconductor multilayer structure, the reliability significantly increases. In other words, when the oxygen content in the near-edge portions of the semiconductor multilayer structure is too large, interface defects and non-radiative recombinations increase. Therefore, the reliability decreases. On the other hand, when the oxygen content in the near-edge portions of the semiconductor multilayer structure is extremely small, oxygen which compensates for lattice defects in compound semiconductor materials becomes insufficient. Therefore, interface defects also increase, and the reliability decreases due to increase in non-radiative recombinations.

Second Embodiment

The second embodiment of the present invention is explained below with reference to FIG. 9, which shows a semiconductor laser device as the second embodiment.

Figure 9:
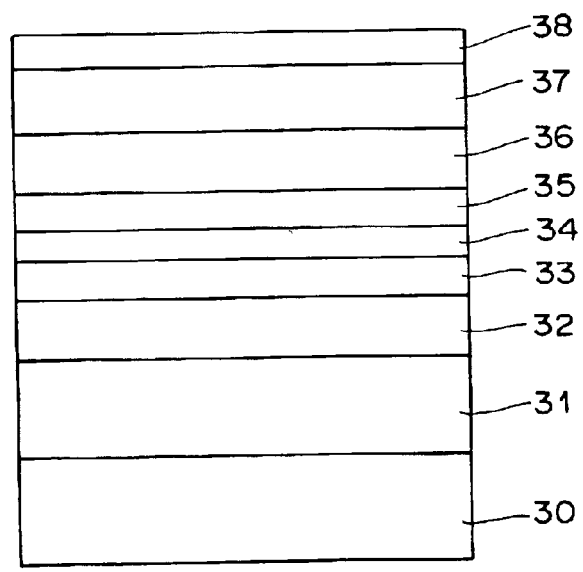
FIG. 9 is a diagrammatical side view of a semiconductor laser device as a second embodiment of the present invention.

As illustrated in FIG. 9, an n-type $In_{0.49}Ga_{0.51}P$ lower cladding layer 31, an i-type $In_{0.2}Ga_{0.8}As_{0.6}P_{0.4}$ lower optical waveguide layer 32, an i-type $GaAs_{0.8}P_{0.2}$ lower barrier layer 33, an $In_{0.3}Ga_{0.7}As$ quantum-well active layer 34, an i-type $GaAs_{0.8}P_{0.2}$ upper barrier layer 35, an i-type $In_{0.2}Ga_{0.8}As_{0.6}P_{0.4}$ upper optical waveguide layer 36, a p-type $In_{0.49}Ga_{0.51}P$ upper cladding layer 37, and a p-type GaAs contact layer 38 are formed in this order on an n-type GaAs substrate 30. The oscillation wavelength of the semiconductor laser device as the second embodiment is 1,060 nm.

The semiconductor laser device as the second embodiment is different from the first embodiment in the emission width (stripe width) and the dielectric layers formed at light-emission end facets as resonator faces. The semiconductor laser device as the second embodiment is a transverse single-mode laser which has an emission width (stripe width) not greater than 5 micrometers.

The dielectric layers in the second embodiment are formed as follows.

After two light-emission end facets of a bar are etched, passivation layers each being made of a silicon film and having a thickness of 1 nm are formed on both of the light-emission end facets. Then, the bar is set in a sputtering system so as to form a first reflectance control layer made of $Al_2O_3$ on the passivation layer formed on one of the light-emission end facets. The first reflectance control layer has a thickness equal to $d_1'=\lambda'/4n_1$ so as to realize the reflectance of 2%, where $\lambda'$ is the oscillation wavelength (e.g., 1.060 nm), and $n_1'$ is the refractive index of $Al_2O_3$ (i.e., 1.67).

In addition, a second reflectance control layer is formed on the passivation layer formed on the other of the light-emission end facets. The second reflectance control layer realizes a reflectance of 95% or greater, and is realized by a multilayer film constituted by at least one pair of $Al_2O_3$ and $TiO_2$ sublayers or at least one pair of $SiO_2$ and $TiO_2$ sublayers. Each of the sublayers has a thickness equal to $d_2'=\lambda'/4n_2'$, where $n_2'$ is the refractive index of the material of each sublayer. In this example, the multilayer film includes ten pairs of sublayers.

The present inventor has also obtained a relationship between the normalized interface oxygen content and the lifetime of the semiconductor laser device as the second embodiment, and found that the relationship is basically similar to the relationship indicated in FIG. 8.

What is claimed is:

1. A semiconductor laser device comprising:
    a multilayer structure including a plurality of semiconductor layers, and being formed on a substrate; and
    at least one dielectric layer formed on each of two end facets of said multilayer structure, where the at least one dielectric layer on each of the two end facets includes a reflectance control layer;

wherein at least one portion of said multilayer structure in at least one vicinity of at least one of said two end facets has a first oxygen content, other portions of said multilayer structure has a second oxygen content, and the first oxygen content is 10 to 1,500 times higher than said second oxygen content.

2. A semiconductor laser device according to claim 1, wherein said first oxygen content in said at least one portion of said multilayer structure is 15 to 1,000 times higher than the second oxygen content in said other portions of said multilayer structure.

3. A semiconductor laser device according to claim 1, wherein said at least one dielectric layer comprises, a passivation layer formed directly on each of said two end facets of said multilayer structure, and said reflectance control layer formed on said passivation layer.

4. A semiconductor laser device according to claim 3, wherein said passivation layer is made of at least one of Ge, Si, and C.

5. A semiconductor laser device according to claim 3, wherein said passivation layer is made of an oxide containing at least one of Al, Ga, Si, Ge, Ta, and Ti.

6. A semiconductor laser device according to claim 3, wherein said passivation layer is made of a nitride containing at least one of Al, Ga, In, Si, Ge, C, Ta, and Ti.

7. A semiconductor laser device according to claim 3, wherein said reflectance control layer is made of an oxide containing at least one of Al, Ga, Si, Ge, Ta, and Ti.

8. A semiconductor laser device according to claim 3, wherein said reflectance control layer is made of a nitride containing at least one of Al, Ga, In, Si, Ge, C, Ta, and Ti.

* * * * *